United States Patent
Kim et al.

(10) Patent No.: US 7,608,204 B2
(45) Date of Patent: Oct. 27, 2009

(54) CONDUCTIVE INK COMPOSITION AND METHOD OF FORMING A CONDUCTIVE PATTERN USING THE SAME

(75) Inventors: Jang-Sub Kim, Suwon-si (KR); Soon-Kwon Lim, Yongin-si (KR); Joo-Ho Moon, Seoul (KR); Sun-Ho Jeong, Seoul (KR); Dong-Jo Kim, Yongin-si (KR); Kyoo-Hee Woo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/018,892

(22) Filed: Jan. 24, 2008

(65) Prior Publication Data

US 2008/0241414 A1 Oct. 2, 2008

(30) Foreign Application Priority Data

Mar. 30, 2007 (KR) .................. 10-2007-0031284

(51) Int. Cl.
*H01B 1/22* (2006.01)
(52) U.S. Cl. .................. 252/512; 106/31.92
(58) Field of Classification Search .......... 252/512; 106/31.92
See application file for complete search history.

(56) References Cited

U.S. PATENT DOCUMENTS

| 6,214,259 | B1* | 4/2001 | Oda et al. .......... 252/500 |
| 2004/0191695 | A1* | 9/2004 | Ray et al. .......... 430/311 |
| 2005/0215689 | A1* | 9/2005 | Garbar et al. .......... 524/440 |
| 2007/0281136 | A1* | 12/2007 | Hampden-Smith et al. .......... 428/195.1 |
| 2007/0283848 | A1* | 12/2007 | Kim et al. .......... 106/31.92 |
| 2007/0289483 | A1* | 12/2007 | Cho et al. .......... 106/31.13 |
| 2008/0241391 | A1* | 10/2008 | Kim et al. .......... 427/256 |

FOREIGN PATENT DOCUMENTS

| JP | 2004185952 | 7/2004 |
| JP | 2006257484 | 9/2006 |
| KR | 1020060017686 | 2/2006 |

* cited by examiner

*Primary Examiner*—Mark Kopec
(74) *Attorney, Agent, or Firm*—F. Chau & Associates, LLC.

(57) ABSTRACT

A conductive ink composition includes about 15% to about 50% by weight of copper nanoparticles, about 40% to about 80% by weight of a non-aqueous solvent mixture, about 0.01% to about 5% by weight of a dispersion agent and about 1% to about 20% by weight of a wetting agent. A conductive pattern may be formed with use of the conductive ink composition and an inkjet printer.

8 Claims, 6 Drawing Sheets

CONDUCTIVE INK COMPOSITION AND METHOD OF FORMING A CONDUCTIVE PATTERN USING THE SAME

CROSS-REFERENCE TO RELATED APPLICATION

This application claims priority under 35 USC §119 to Korean Patent Application No. 2007-31284, filed on Mar. 30, 2007 in the Korean Intellectual Property Office (KIPO), the contents of which are herein incorporated by reference in their entirety.

BACKGROUND OF THE INVENTION

1. Technical Field

The present invention relates to a conductive ink composition and a method of forming a conductive pattern using the conductive ink composition.

2. Discussion of the Related Art

An optical patterning method using a photolithography process is used for forming a conductive pattern. However, the optical patterning method using the photolithography process requires many processing steps and is complicated, so that the manufacturing costs for forming the conductive pattern are increased. Types of substrates usable in the optical patterning method may be limited due to an exposure process and a development process. Furthermore, environmental pollution may be caused by gas and wastewater generated in the exposure process and the development process.

A direct drawing method using inkjet printing has been developed in place of the photolithography process.

The inkjet printing method directly draws a desired pattern on a substrate. The inkjet printing method can be used for large-size printing and various types of substrates. Thus, manufacturing time and manufacturing costs may be reduced. Furthermore, the inkjet printing method does not include an exposure process and an etching process that does not generate environmental pollutants.

The inkjet printing method for forming a conductive pattern uses a conductive ink that is a liquid material having a low viscosity to form the conductive pattern. The conductive ink may include, for example, molten metal, a conductive polymer, a metal salt, or metal nanoparticles. The molten metal has a relatively high conductivity. However, the molten metal has a high temperature, and thus the molten metal is difficult to apply to actual inkjet printing processes. Poly(ethylenedioxythiophene) doped with poly(styrene sulfonic acid) (PEDOT/PSS), which is a conductive polymer, has a relatively high conductivity among conductive polymers and relatively high stability in air. However, the conductivity of the PEDOT/PSS is about 0.1 S/cm, that is much less than the conductivity of a metal at about $10^5$ S/cm to about $10^6$ S/cm. Thus, research has been conducted on an ink containing metal nanoparticles capable of having a relatively high conductivity through a heating process at a relatively low temperature.

The metal nanoparticles may include, for example, gold, silver, platinum, or copper. The ink containing copper nanoparticles has low manufacturing costs and a relatively high conductivity. However, the ink containing the copper nanoparticles has relatively low oxidation stability.

SUMMARY OF THE INVENTION

The present invention provides a conductive ink composition capable of reducing manufacturing costs of a conductive pattern and improving the oxidation stability of a conductive pattern and a method of forming a conductive pattern using the above-mentioned conductive ink composition.

In an exemplary embodiment of the present invention, a conductive ink composition includes about 15% to about 50% by weight of copper nanoparticles, about 40% to about 80% by weight of a non-aqueous solvent mixture, about 0.01% to about 5% by weight of a dispersion agent and about 1% to about 20% by weight of a wetting agent.

For example, the non-aqueous solvent mixture may include a first solvent, of which a viscosity is about 0.1 mPa·s to about 5 mPa·s at about 25° C., a second solvent, of which a viscosity is about 15 mPa·s to about 40 mPa·s at about 25° C., and a third solvent, of which a vapor pressure is about 10 mmHg to about 250 mmHg at about 25° C.

The first solvent may include, for example, 2-methoxyethanol, propyl alcohol, pentyl alcohol, hexyl alcohol, butyl alcohol, octyl alcohol, formamide, methyl ethyl ketone, etc. Examples of the second solvent may include ethylene glycol, diethylene glycol, triethylene glycol, polyethylene glycol, propylene glycol, dipropylene glycol, hexylene glycol, glycerin, etc. The third solvent may include ethyl alcohol, methyl alcohol, isopropyl alcohol, acetone, etc.

The non-aqueous solvent mixture may include about 30% to about 60% by weight of the first solvent, about 30% to about 60% by weight of the second solvent and about 10% to about 30% by weight of the third solvent, based on a total weight of the non-aqueous solvent mixture.

In an exemplary embodiment, an average diameter of the copper nanoparticles may be about 1 nm to about 100 nm, and the copper nanoparticle may have a skin layer including a capping polymer.

The viscosity of the conductive ink composition may be about 0.5 mPa·s to about 40 mPa·s at about 25° C., and the surface tension of the conductive ink composition may be about 20 mN/m to about 70 mN/m at about 25° C.

In an exemplary embodiment of the present invention, a conductive ink composition is sprayed onto a substrate. The conductive ink composition is heated to form a conductive pattern.

The conductive ink composition includes copper nanoparticles and a non-aqueous solvent mixture, and may further include a dispersion agent and/or a wetting agent. For example, the conductive ink composition may include about 15% to about 50% by weight of the copper nanoparticles, about 40% to about 80% by weight of the non-aqueous solvent mixture, about 0.01% to about 5% by weight of the dispersion agent and about 1% to about 20% by weight of the wetting agent.

For example, the non-aqueous solvent mixture may include a first solvent, of which a viscosity is about 0.1 mPa·s to about 5 mPa·s at about 25° C., a second solvent, of which a viscosity is about 15 mPa·s to about 40 mPa·s at about 25° C., and a third solvent, of which a vapor pressure is about 10 mmHg to about 250 mmHg at about 25° C.

For example, the conductive ink composition may be sprayed by an inkjet printer according to a piezoelectric method, and the conductive ink composition may be heated at a temperature of about 100° C. to about 400° C. Furthermore, the conductive ink composition may be heated in an atmosphere including an inactive gas.

According to the above, a conductive pattern may be easily formed using an inkjet printer. Furthermore, manufacturing costs of a conductive ink composition may be reduced, and the oxidation stability of the conductive pattern may be improved.

BRIEF DESCRIPTION OF THE DRAWINGS

Exemplary embodiments of the present invention can be understood in more detail from the following descriptions taken in conjunction with the accompanying drawings wherein.

DESCRIPTION OF EXEMPLARY EMBODIMENTS

Figure 1:
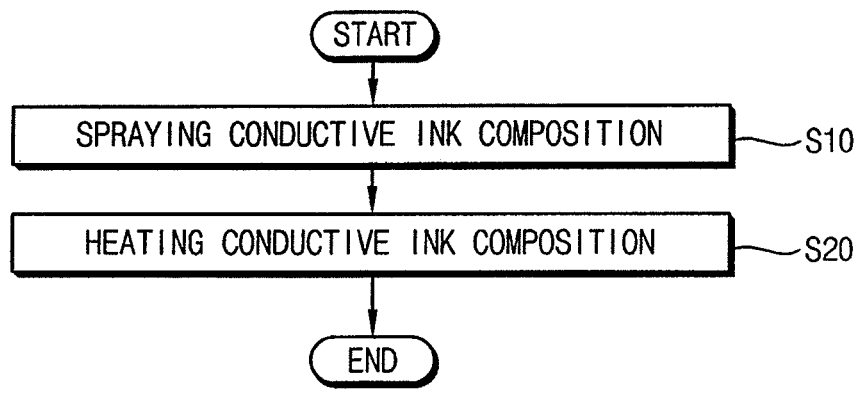
FIG. 1 is a flow chart explaining a method of forming a conductive pattern according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein.

A conductive ink composition according to an exemplary embodiment of the present invention includes about 15% to about 50% by weight of copper nanoparticles, about 40% to about 80% by weight of a non-aqueous solvent mixture, about 0.01% to about 5% by weight of a dispersion agent and about 1% to about 20% by weight of a wetting agent.

For example, the non-aqueous solvent mixture may include a first solvent, of which a viscosity is about 0.1 mPa·s to about 5 mPa·s at about 25° C., a second solvent, of which a viscosity is about 15 mPa·s to about 40 mPa·s at about 25° C., and a third solvent, of which a vapor pressure is about 10 mmHg to about 250 mmHg at about 25° C. When the content of the non-aqueous solvent mixture is less than about 39% by weight based on a total weight of the ink composition, the viscosity of the ink composition excessively increases so that the ink composition is not stably sprayed.

When the content of the non-aqueous solvent mixture is more than about 81% by weight based on a total weight of the ink composition, the density of the copper nanoparticles decreases so that a conductivity of a pattern formed from the ink composition is reduced. An exemplary embodiment of the present invention does not include water so that the oxidation stability of the copper nanoparticles may be improved.

The diameter of the copper nanoparticles may be about 1 nm to about 100 nm. In an exemplary embodiment, the diameter of the copper nanoparticles may be about 1 nm to about 50 nm. The copper nanoparticles may be prepared by a conventional method of forming copper nanoparticles, for example, a polyol method.

The copper nanoparticles may be combined with capping polymers to form a skin-core structure. The capping polymers may form a skin layer surrounding each of the copper nanoparticles. The skin layer may include copper oxide mixed with the capping polymers.

The capping polymers may include, for example, polyvinyl pyrrolidone (PVP). The capping polymers may be applied into a copper salt solution in the course of preparing the copper nanoparticles. The polyvinyl pyrrolidone may be combined with copper ions in the copper salt solution to form a coordinate covalent bond. For example, the weight-average molecular weight of the polyvinyl pyrrolidone may be greater than about 10,000. When the weight-average molecular weight of the polyvinyl pyrrolidone is greater than about 10,000, a fraction of the copper oxide may be reduced. Thus, a melting bond temperature of the copper nanoparticles is reduced, and a conductivity of a conductive pattern from the ink composition may be increased.

The viscosity of the first solvent is relatively low. The first solvent may include, for example, 2-methoxy ethanol, propyl alcohol, pentyl alcohol, hexyl alcohol, butyl alcohol, octyl alcohol, formamide, methyl ethyl ketone, etc. These can be used alone or in a combination thereof.

For example, the content of the first solvent may be about 30% to about 60% by weight based on a total weight of the non-aqueous solvent mixture. In an exemplary embodiment, the content of the first solvent may be about 50% to about 60%. When the content of the first solvent is less than about 29% by weight, the ink composition may not be stably sprayed. When the content of the first solvent is more than about 61% by weight, a time for drying may be increased so that forming a fine conductive pattern is difficult.

The viscosity of the second solvent is relatively high. Examples of the second solvent may include ethylene glycol, diethylene glycol, triethylene glycol, polyethylene glycol, propylene glycol, dipropylene glycol, hexylene glycol, glycerin, etc. These can be used alone or in a combination thereof.

The content of the second solvent may be about 30% to about 60% by weight based on the total weight of the non-aqueous solvent mixture. In an exemplary embodiment, the content of the second solvent may be about 30% to about 40%. When the content of the second solvent is less than about 29% by weight, forming a fine conductive pattern may be difficult. When the content of the second solvent is more than about 61% by weight, the ink composition may not be stably sprayed.

The vapor pressure of the third solvent is relatively low. Thus, an evaporation speed of the third solvent is relatively high. Examples of the third solvent may include any of ethyl alcohol, methyl alcohol, isopropyl alcohol, acetone, or any combination thereof.

The content of the third solvent may be about 10% to about 30% by weight based on the total weight of the non-aqueous solvent mixture. In an exemplary embodiment. The content of the third solvent may be about 10% to about 20%. When the content of the third solvent is less than about 9% by weight, a time for drying may be increased so that forming a fine conductive pattern may be difficult. When the content of the third solvent is more than about 31% by weight, an evaporation speed of the non-aqueous solvent mixture at an interface of a nozzle of a printer may excessively increase so that the nozzle of the printer is blocked.

The dispersion agent may be used for dispersing the copper nanoparticles in the ink composition. Examples of the dispersion agent may include conventional dispersion agents. Examples of the dispersion agent may include the 4000 series dispersion agent (trade name manufactured by EFKA in Netherlands), the DISPERBYK series dispersion agent (trade name manufactured by BYK in Germany), the SOLSPERSE series dispersion agent (trade name manufactured by Avecia in U.K.), the TEGO Disperse series dispersion agent (trade name manufactured by Degussa in Germany), the DISPERSE-AYD series dispersion agent (trade name manufactured by Elementis in U.S.A.), the JONCRYL series dispersion agent (trade name manufactured by Johnson Polymer in U.S.A.), etc. These can be used alone or in a combination thereof.

When the content of the dispersion agent is less than about 0.01% by weight based on the total weight of the ink composition, the copper nanoparticles may form a clump. When the content of the dispersion agent is more than about 5% by weight, dispersion agent molecules may cohere with each other so that dispersion ability of the dispersion agent is reduced.

The wetting agent maintains the humidity of the ink composition to prevent clogging of the ink composition at an interface of the nozzle of the printer. Examples of the wetting agent may include conventional wetting agents. Examples of the wetting agent may include polyethylene glycol, the SURFYNOL series wetting agent (trade name manufactured by Air Product in U.S.A.), the TEGO wet series wetting agent (trade name manufactured by Degussa in Germany), etc. These can be used alone or in a combination thereof.

When the ink composition is sprayed by an inkjet printer, the ink composition may have a predetermined viscosity and a predetermined surface tension suitable for an inkjet printing method. In an exemplary embodiment, when the ink composition is sprayed by a piezoelectric inkjet printer, the viscosity of the ink composition may be about 0.5 mPa·s to about 40 mPa·s at about 25° C., and the surface tension of the ink composition may be about 20 mN/m to about 70 mN/m at about 25° C. When the viscosity and the surface tension of the ink composition are not within the ranges, the ink composition may not be sprayed, or a droplet of the ink composition may not be uniform.

When the ink composition is sprayed by the inkjet printer, a high shear stress is applied to the ink composition adjacent to the nozzle of the inkjet printer. Thus, the ink composition may behave according to Newtonian flow to prevent the viscosity of the ink composition from excessively increasing.

The conductive ink composition according to an exemplary embodiment of the present invention includes relatively low-cost copper nanoparticles compared to precious metals. Thus, manufacturing costs of a conductive pattern formed using a printing method may be reduced. Furthermore, the conductive ink composition includes a non-aqueous solvent. Thus, the oxidation stability of the copper nanoparticles may be improved, and the conductive ink composition may have flow characteristics suitable for an inkjet printing method.

FIG. 1 is a flow chart explaining a method of forming a conductive pattern according to an exemplary embodiment of the present invention. A conductive ink composition is sprayed onto a substrate (step S10). The conductive ink composition is heated to form a conductive pattern (step S20).

The conductive ink composition may include copper nanoparticles and a non-aqueous solvent mixture, and may further include a dispersion agent and/or a wetting agent. In an exemplary embodiment, the conductive ink composition may include about 15% to about 50% by weight of the copper nanoparticles, about 40% to about 80% by weight of the non-aqueous solvent mixture, about 0.01% to about 5% by weight of the dispersion agent and about 1% to about 20% by weight of the wetting agent.

In an exemplary embodiment, the non-aqueous solvent mixture may include a first solvent, of which a viscosity is about 0.1 mPa·s to about 5 mPa·s at about 25° C., a second solvent, of which a viscosity is about 15 mPa·s to about 40 mPa·s at about 25° C., and a third solvent, of which a vapor pressure is about 10 mmHg to about 250 mmHg at about 25° C.

The viscosity of the first solvent is relatively low. Examples of the first solvent may include 2-methoxy ethanol, propyl alcohol, pentyl alcohol, hexyl alcohol, butyl alcohol, octyl alcohol, formamide, methyl ethyl ketone, etc. These can be used alone or in a combination thereof.

The viscosity of the second solvent is relatively high. Examples of the second solvent may include ethylene glycol), diethylene glycol, triethylene glycol, polyethylene glycol, propylene glycol, dipropylene glycol, hexylene glycol, glycerin, etc. These can be used alone or in a combination thereof.

The vapor pressure of the third solvent is relatively low. Thus, an evaporation speed of the third solvent is relatively high. Examples of the third solvent may include ethyl alcohol, methyl alcohol, isopropyl alcohol, acetone, etc. These can be used alone or in a combination thereof.

Examples of the dispersion agent and the wetting agent may include conventional dispersion agents and conventional wetting agents. The conductive ink composition may be substantially the same as the above-explained the conductive ink composition according to an exemplary embodiment of the present invention. Thus, any further explanation of the conductive ink composition will be omitted.

Various substrates may be used as the substrate. The substrate may include, for example, a metal substrate, a glass substrate, a silicon wafer, a polyester film, or a polyimide film.

The conductive ink composition may be sprayed through an inkjet printer. A spraying method of the inkjet printer may include a continuous jet method and a drop-on-demand method. The continuous jet method continuously sprays ink using a pump, and controls a spraying direction by varying an electromagnetic field. The drop-on-demand method sprays ink at the desired time using an electric signal.

The drop-on-demand method may include a piezoelectric method using a piezoelectric plate physically deformed by electricity to generate pressure, and a thermal transcription method using pressure due to a bubble expanded by heat. In an exemplary embodiment, the conductive ink composition may be sprayed by an inkjet printer according to the piezoelectric method.

The conductive ink composition is heated. In an exemplary embodiment, the conductive ink composition is heated at a temperature of about 100° C. to about 400° C. When the conductive ink composition is heated, the solvent of the conductive ink composition is evaporated, and the copper nanoparticles are inseparably fused to form a conductive pattern. When the copper nanoparticle is combined with a capping polymer, the capping polymer may be decomposed by heat.

The melting point of copper bulk is about 1083° C. However, copper particles, of which the particle diameter is less than or equal to about 100 nm, have a surface area with respect to a volume, which is greater than that of the copper bulk. Thus, the copper particles have a high surface energy, and the copper particles may be fused below the melting point of the copper bulk since the copper particles intend to reduce the surface area thereof to be stabilized.

For example, the conductive ink composition may be heated in an atmosphere including an inactive gas. When the conductive ink composition is heated in an inactive gas, oxidation of the conductive pattern formed from the conductive ink composition may be prevented and/or reduced so that the conductivity of the conductive pattern is increased. Examples of the inactive gas may include, for example, a nitrogen gas, an argon gas, or a helium gas.

A method of forming a conductive pattern according to an exemplary embodiment of the present invention uses a conductive ink composition including copper nanoparticles. Thus, the manufacturing costs of the conductive pattern may be reduced. The conductive ink composition includes a non-aqueous solvent and may be heated in an inactive gas so that oxidation of the conductive pattern may be prevented and/or reduced.

A method of forming a conductive pattern according to an exemplary embodiment of the present invention may form a conductive pattern having a relatively high conductivity, and may be used for manufacturing a liquid crystal display apparatus, a plasma display panel, an electric tag, a circuit board, or a sensor.

According to an embodiment of the present invention, about 16 g of polyvinyl pyrrolidone, having a molecular weight of about 10,000, and about 220 mL of diethylene glycol were mixed and stirred at a normal temperature. The mixture was provided with about 1.8587 g of sodium phosphinate monohydrate serving as a reducing agent, and then stirred at a normal temperature to prepare a solvent mixture.

About 10.1617 g of copper sulfate pentahydrate and about 30 g of pure water were mixed and stirred at a normal temperature to dissolve the copper sulfate pentahydrate in the pure water, to thereby prepare a copper salt mixture.

After the solvent mixture had been heated to about 140° C., about 4 mL of the copper salt mixture per minute was provided to the solvent mixture. After maintaining a reaction of the solvent mixture and the copper salt mixture for about 1 hour, thus obtained particles were separated from the mixture by a centrifugal separator. The particles are cleaned two times using methanol, and dried in a vacuum oven to prepare copper nanoparticles.

About 50 parts by weight of ethylene glycol, about 40 parts by weight of 2-methoxy ethanol and about 10 parts by weight of methanol were mixed and stirred to prepare a non-aqueous solvent mixture. About 80 parts by weight of the non-aqueous solvent mixture, about 1 part by weight of a dispersion agent, about 5 parts of a wetting agent and about 20 parts by weight of the copper nanoparticles were mixed and then stirred by a ball milling method to prepare a conductive ink composition.

The conductive ink composition was sprayed onto a glass substrate by a printer to form a coated layer having a thickness of about 5 μm. The printer had a piezoelectric nozzle and was operated according to a drop-on-demand method. The coated layer was heated by gradually increasing a temperature from about 200 to about 350° C.

Figure 2:
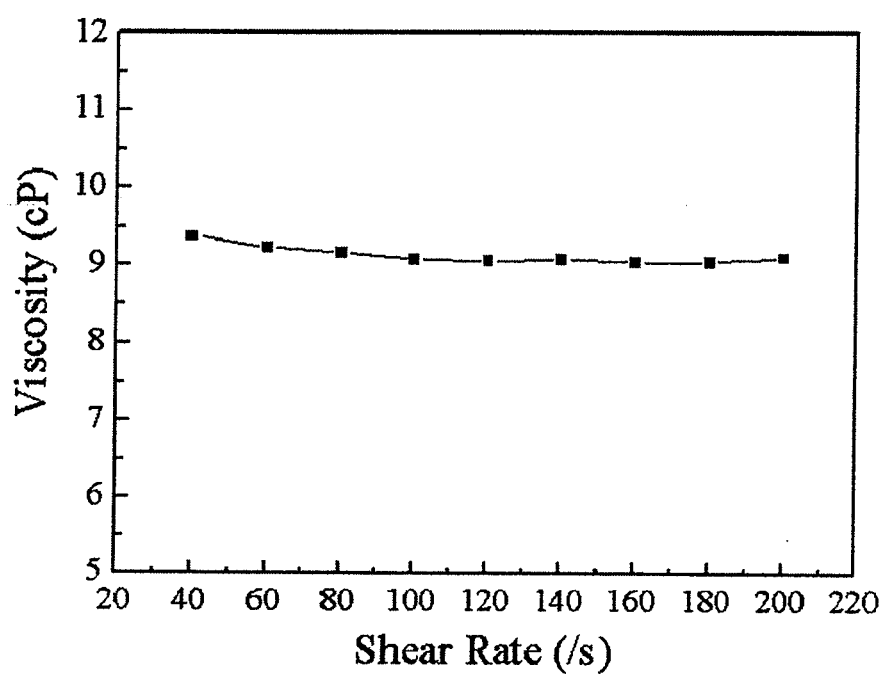
FIG. 2 is a graph showing the viscosity of the conductive ink composition according to an exemplary embodiment of the present invention.
Figure 3:
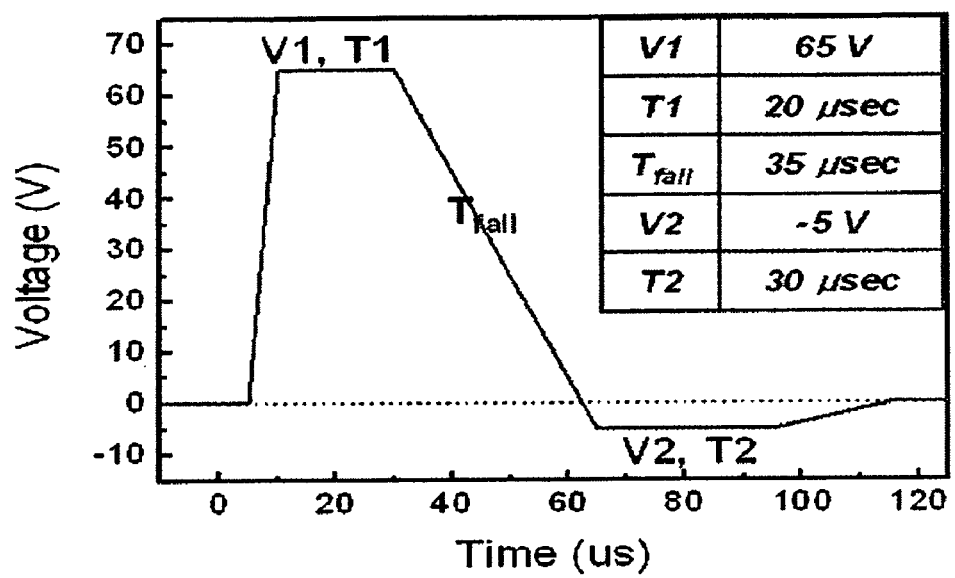
FIG. 3 is a graph showing a voltage applied to a piezoelectric device of an inkjet printer when the conductive ink composition according to an exemplary embodiment of the present invention is sprayed by the inkjet printer.
Figure 4:
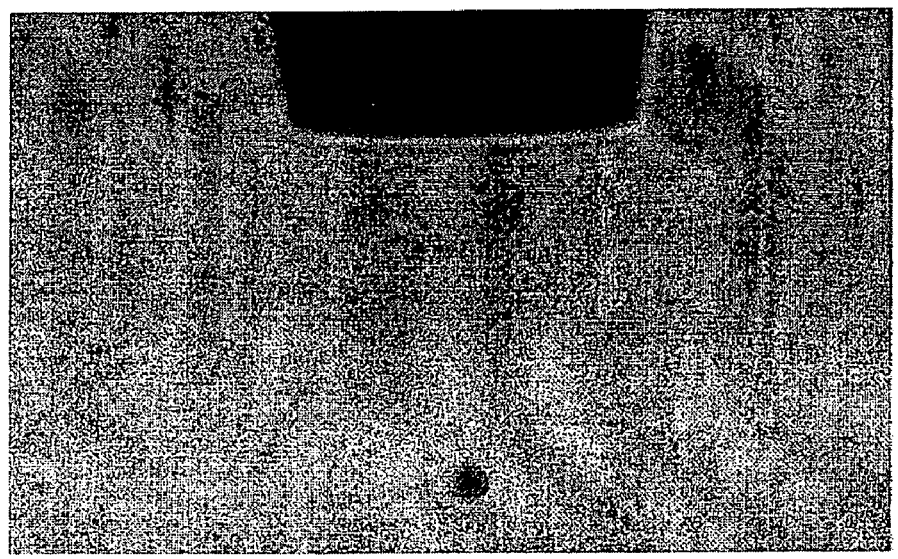
FIG. 4 is a picture showing a droplet of the conductive ink composition according to an exemplary embodiment of the present invention after being released from a nozzle of an inkjet printer.
Figure 5:
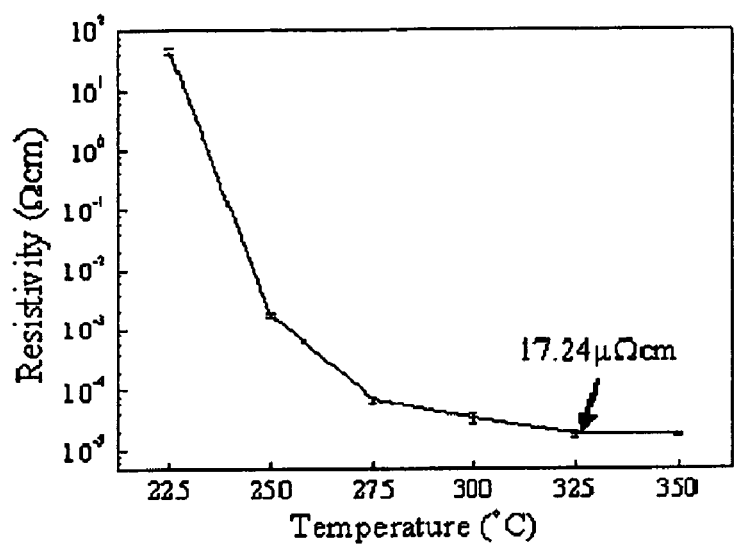
FIG. 5 is a graph showing a resistance of the conductive pattern according to an exemplary embodiment of the present invention.
Figure 6A:
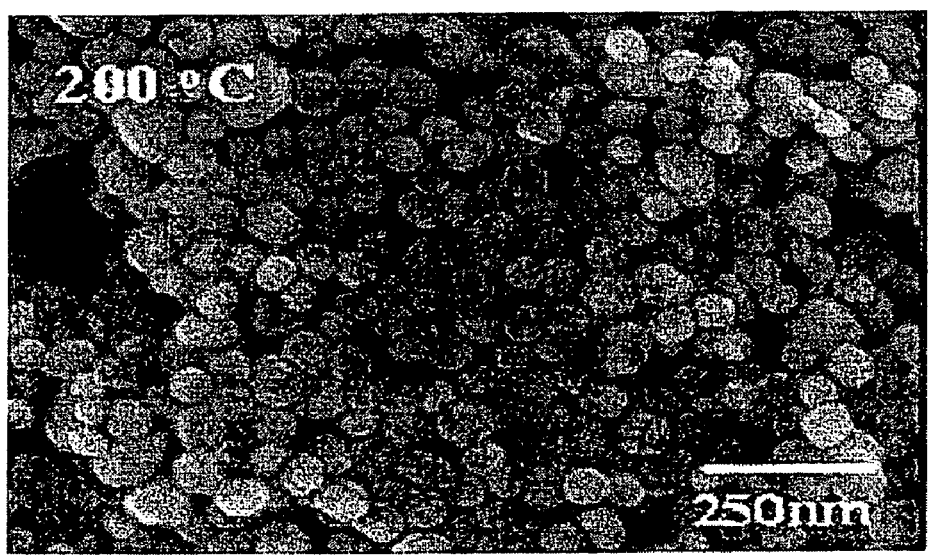
FIGS. 6A to 6D are scanning electron microscope (SEM) pictures showing copper nanoparticles of the conductive pattern according to an exemplary embodiment of the present invention in the course of melting and fusing.
Figure 6B:
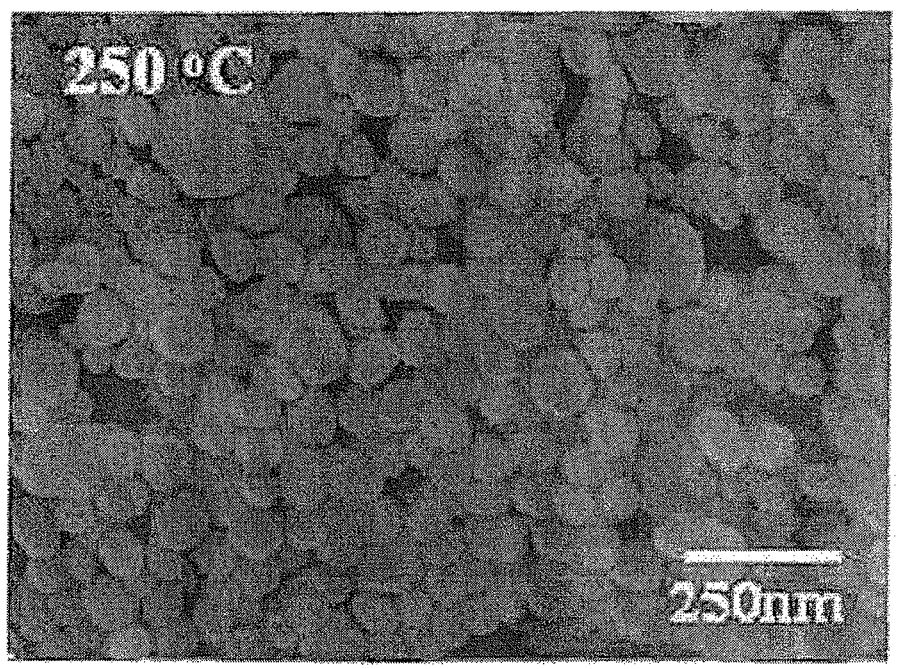
Figure 6C:
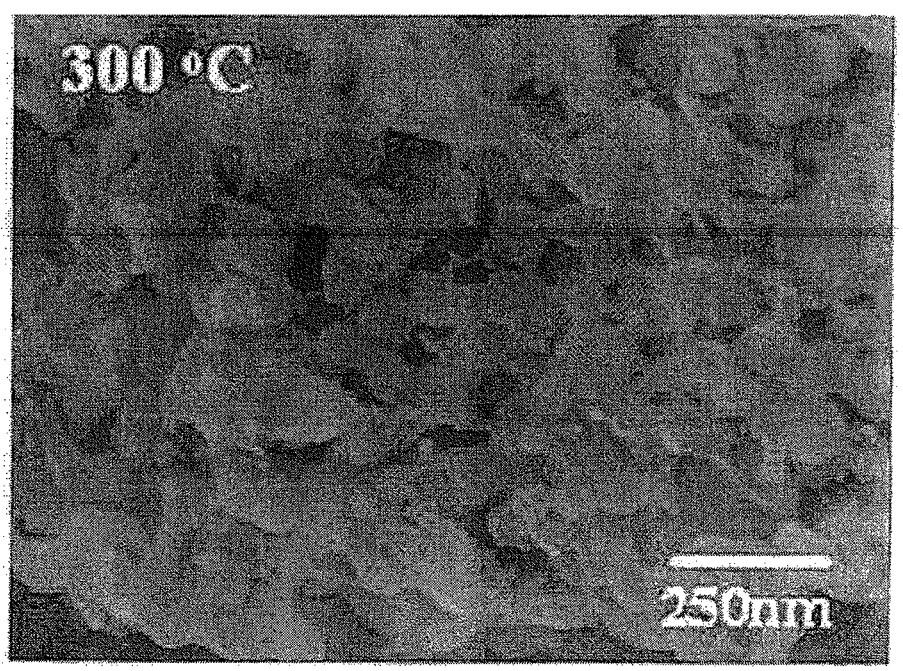
Figure 6D:
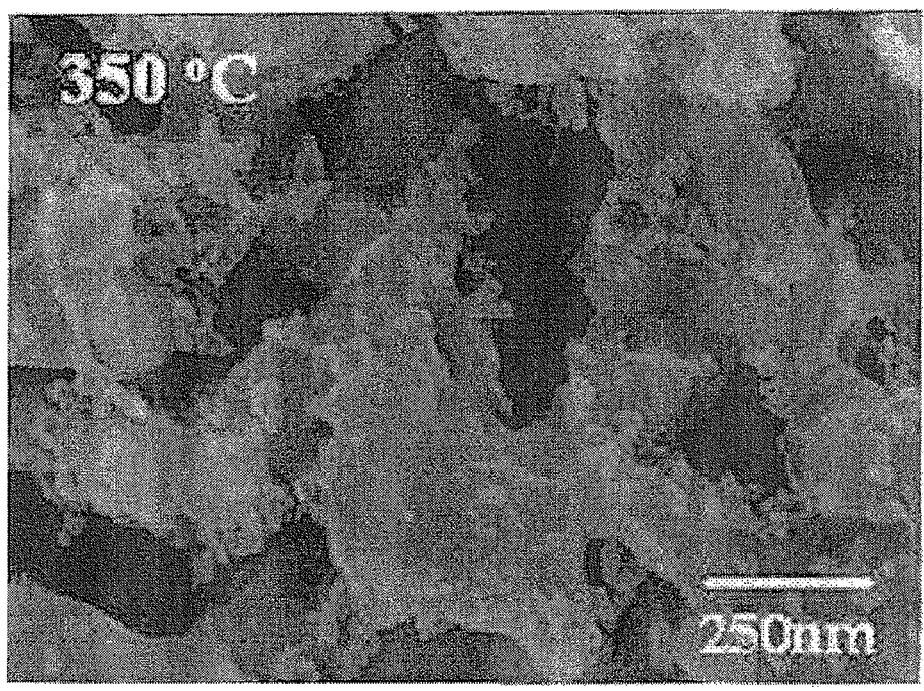
Figure 7A:
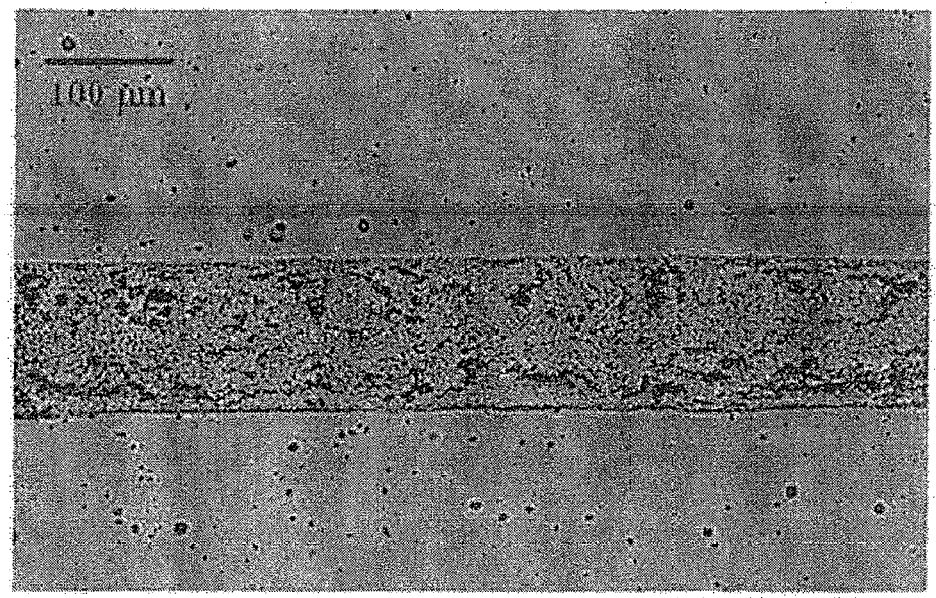
FIGS. 7A and 7B are pictures showing conductive patterns formed by a method of forming a conductive pattern according to an exemplary embodiment of the present invention.
Figure 7B:
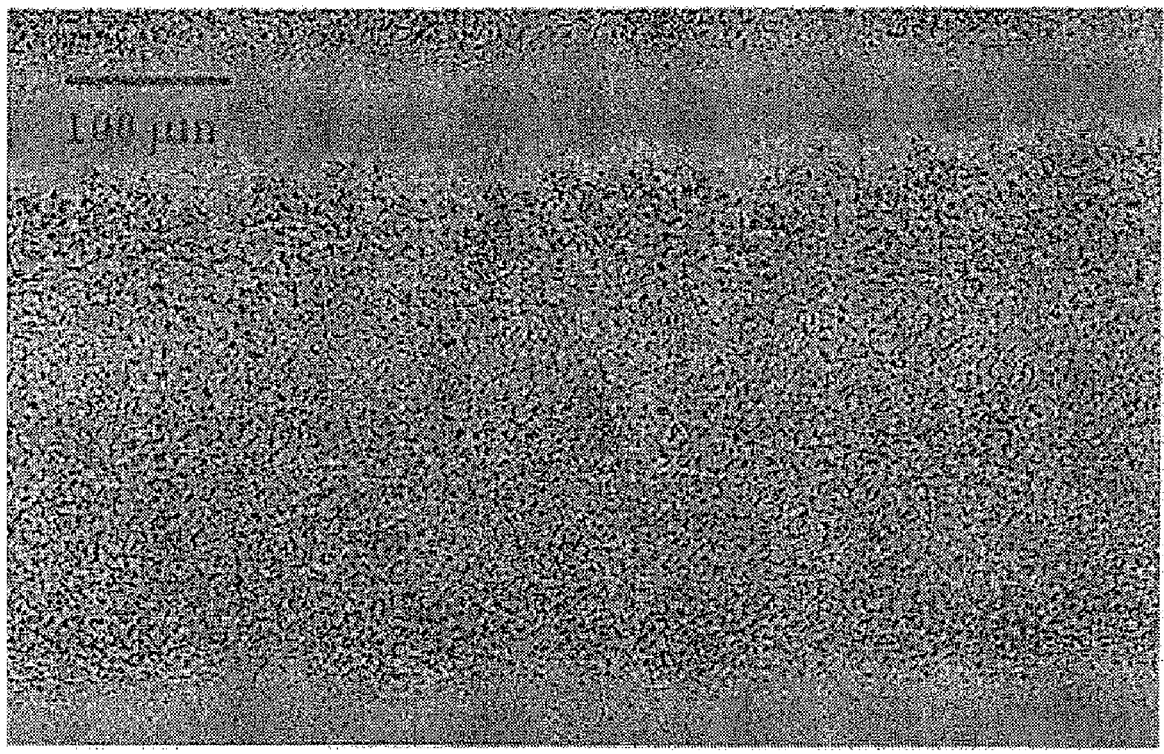

FIG. 2 is a graph showing the viscosity of the conductive ink composition according to an exemplary embodiment of the present invention. FIG. 3 is a graph showing a voltage applied to a piezoelectric device of an inkjet printer when the conductive ink composition is sprayed by the inkjet printer. FIG. 4 is a picture showing a droplet of the conductive ink composition after being released from a nozzle of an inkjet printer. FIG. 5 is a graph showing a resistance of the conductive pattern of Example 1. FIGS. 6A to 6D are scanning electron microscope (SEM) pictures showing copper nanoparticles of the conductive pattern in the course of melting and fusing. FIG. 6A is a SEM picture showing the copper nanoparticles at a temperature of about 200° C., FIG. 6B is a SEM picture showing the copper nanoparticles at a temperature of about 250° C., FIG. 6C is a SEM picture showing the copper nanoparticles at a temperature of about 300° C., and FIG. 6D is a SEM picture showing the copper nanoparticles at a temperature of about 350° C. FIGS. 7A and 7B are pictures showing conductive patterns formed by a method of forming a conductive pattern according to an exemplary embodiment of the present invention. FIG. 7A is a picture showing a conductive pattern formed on a polyimide substrate by using the conductive ink composition according to an exemplary embodiment of the present invention, and FIG. 7B is a picture showing a conductive pattern formed on a glass substrate by using the conductive ink composition.

Referring to FIG. 2, the viscosity of the conductive ink composition of was about 9.05 mPa·s to about 9.37 mPa·s, and the surface tension of the conductive ink composition was about to 35.8 mN/m. The horizontal axis of FIG. 2 illustrates a shearing rate, and the viscosity of the conductive ink composition was measured at a temperature of about 25° C. The viscosity and the surface tension of the conductive ink composition satisfied a condition suitable for being sprayed by an inkjet printer, in which a viscosity is about 0.5 mPa·s to about to 40 mPa·s, and a surface tension is about 40 mN/m to about 70 mN/m.

Referring to FIG. 3, a first voltage V1 of about 65 V was applied to a piezoelectric device of the inkjet printer to spray the conductive ink composition. The first voltage had been applied to the piezoelectric device for a first time period T1 of about 20 μs. After the conductive ink composition was sprayed, the voltage applied to the piezoelectric device was gradually lowered to a second voltage V2 of about −5 V for about 35 μs. The second voltage V2 had been maintained for a second time period T2 of about 30 μs. As the piezoelectric devices changed into an initial state, the voltage applied to the piezoelectric device was gradually reduced.

Referring to FIG. 4, the conductive ink composition sprayed by the inkjet printer has a single drop.

Referring to FIG. 5, the resistance of the conductive pattern was reduced as the conductive pattern was heated, and the resistance of the conductive pattern was about 17.24 μΩ/cm after heating of the conductive pattern was completed.

Referring to FIGS. 6A to 6D, the copper nanoparticles having substantially spherical shapes was melted and fused as the heating temperature was increased.

Referring to FIGS. 7A and 7B, it can be seen that the conductive ink composition may form a conductive pattern on a glass substrate or a synthetic resin substrate.

Although the exemplary embodiments of the present invention have been described herein with reference with the accompanying drawings, it is understood that the present invention should not be limited to these exemplary embodiments, and that various other changes and modifications may be made by one of ordinary skill in the related art without departing from the scope or spirit of the invention. All such changes and modifications are intended to be included within the scope of the invention as defined by the appended claims.

What is claimed is:

1. A conductive ink composition comprising:
    about 40% to about 80% by weight of a non-aqueous solvent mixture comprising a first solvent having a viscosity of about 0.1 mPa·s to about 5 mPa·s at about 25° C., a second solvent having a viscosity of about 15 mPa·s to about 40 mPa·s at about 25° C., and a third solvent having a vapor pressure of about 10 mmHg to about 250 mmHg at about 25° C.;

about 15% to about 50% by weight of copper nanoparticles;

about 0.01% to about 5% by weight of a dispersion agent; and about 1% to about 20% by weight of a wetting agent.

2. The conductive ink composition of claim 1, wherein the first solvent comprises at least one selected from the group consisting of 2-methoxy ethanol, propyl alcohol, pentyl alcohol, hexyl alcohol, butyl alcohol, octyl alcohol, formamide and methyl ethyl ketone.

3. The conductive ink composition of claim 1, wherein the second solvent comprises at least one selected from the group consisting of ethylene glycol, diethylene glycol, triethylene glycol, polyethylene glycol, propylene glycol, dipropylene glycol, hexylene glycol and glycerin.

4. The conductive ink composition of claim 1, wherein the third solvent comprises at least one selected from the group consisting of ethyl alcohol, methyl alcohol, isopropyl alcohol and acetone.

5. The conductive ink composition of claim 1, wherein the non-aqueous solvent mixture comprises about 30% to about 60% by weight of the first solvent, about 30% to about 60% by weight of the second solvent and about 10% to about 30% by weight of the third solvent, based on a total weight of the non-aqueous solvent mixture.

6. The conductive ink composition of claim 1, wherein an average diameter of the copper nanoparticles is about 1 nm to about 100 nm.

7. The conductive ink composition of claim 1, wherein the copper nanoparticle comprises a skin layer including a capping polymer.

8. The conductive ink composition of claim 1, wherein the viscosity of the conductive ink composition is about 0.5 mPa·s to about 40 mPa·s at about 25° C., and the surface tension of the conductive ink composition is about 20 mN/m to about 70 mN/m at about 25° C.

* * * * *